(12) United States Patent
White

(10) Patent No.: US 10,126,790 B2
(45) Date of Patent: Nov. 13, 2018

(54) DUAL LOOP SUSCEPTOR TEMPERATURE CONTROL SYSTEM

(71) Applicant: Applied Materials, Inc., Santa Clara, CA (US)

(72) Inventor: John M. White, Hayward, CA (US)

(73) Assignee: APPLIED MATERIALS, INC., Santa Clara ( * ) Notice: Subject to any disclaimer, the term of this patent is extended or adjusted under 35 U.S.C. 154(b) by 254 days.

(21) Appl. No.: 15/147,908

(22) Filed: May 5, 2016

(65) Prior Publication Data

US 2017/0322606 A1 Nov. 9, 2017

(51) Int. Cl.
| | |
|---|---|
| *G06F 1/20* | (2006.01) |
| *G05B 15/02* | (2006.01) |
| *G05D 7/06* | (2006.01) |
| *G05D 23/13* | (2006.01) |
| *H01L 21/67* | (2006.01) |

(52) U.S. Cl.
CPC ............... *G06F 1/20* (2013.01); *G05B 15/02* (2013.01); *G05D 7/0676* (2013.01); *G05D 23/1393* (2013.01); *H01L 21/67103* (2013.01)

(58) Field of Classification Search
CPC .......... G05B 15/02; G05D 7/0676; G06F 1/20
See application file for complete search history.

(56) References Cited

U.S. PATENT DOCUMENTS

| | | | | |
|---|---|---|---|---|
| 5,844,205 A | * | 12/1998 | White ................ | C23C 16/4586 219/390 |
| 5,846,396 A | * | 12/1998 | Zanzucchi .......... | B01F 13/0077 141/31 |
| 9,804,607 B1 | * | 10/2017 | Coleman ................ | G05D 7/00 |
| 9,818,630 B2 | * | 11/2017 | Takahashi ......... | H01L 21/67098 |
| 2002/0066726 A1 | * | 6/2002 | Cole, Sr. ............. | G01R 31/2891 219/444.1 |
| 2003/0160022 A1 | * | 8/2003 | Wang ................ | H01L 21/30608 216/2 |
| 2004/0187787 A1 | | 9/2004 | Dawson et al. | |
| 2005/0229854 A1 | | 10/2005 | Moroz | |

(Continued)

OTHER PUBLICATIONS

International Search Report and Written Opinion for PCT/US2017/029188 dated Jul. 25, 2017.

*Primary Examiner* — Kenneth M Lo
*Assistant Examiner* — Chad Erdman
(74) *Attorney, Agent, or Firm* — Patterson + Sheridan LLP

(57) ABSTRACT

Embodiments described herein generally relate to a temperature control system for a substrate support assembly disposed in a substrate processing system. In one embodiment, a temperature control system is disclosed herein. The temperature control system includes a remote fluid source and a main frame system. The remote fluid source includes a first reservoir and a second reservoir. The main frame system includes a first fluid loop and a second fluid loop. The first fluid loop is coupled to, and configured to receive a first fluid from, the first reservoir. The second fluid loop is coupled to and configured to receive a second fluid from the second reservoir. The first proportioning valve has a first inlet in communication with the first fluid loop and a second inlet in communication with the second fluid loop. The first proportioning valve has an outlet configured to flow a third fluid.

10 Claims, 5 Drawing Sheets

(56) References Cited

U.S. PATENT DOCUMENTS

| | | | |
|---|---|---|---|
| 2006/0118243 A1* | 6/2006 | Choi | H01L 21/67109 |
| | | | 156/345.51 |
| 2007/0204914 A1* | 9/2007 | Kurosawa | G05D 11/132 |
| | | | 137/487.5 |
| 2009/0047185 A1* | 2/2009 | Fennimore | C01B 3/065 |
| | | | 422/129 |
| 2011/0180243 A1 | 7/2011 | Bera et al. | |
| 2011/0265951 A1* | 11/2011 | Xu | C23C 16/45561 |
| | | | 156/345.26 |
| 2011/0284505 A1 | 11/2011 | Ricci et al. | |
| 2014/0131005 A1 | 5/2014 | Atlas | |
| 2016/0284521 A1* | 9/2016 | Miyagawa | H01J 37/32449 |
| 2017/0357277 A1* | 12/2017 | Ono | G05D 23/1951 |

* cited by examiner

DUAL LOOP SUSCEPTOR TEMPERATURE CONTROL SYSTEM

BACKGROUND

Field

Embodiments described herein generally relate to a temperature control system for a substrate processing system, and more specifically, to a temperature control system for regulating the temperature of a substrate support assembly disposed in a substrate processing system.

Description of the Related Art

Flat panel displays (FPD) are commonly used for active matrix displays such as computer and television monitors, personal digital assistants (PDAs), and cell phones, as well as solar cells and the like. Plasma enhanced chemical vapor deposition (PECVD) may be employed in flat panel display fabrication to deposit thin film on a substrate supported within a vacuum processing chamber on a substrate support assembly. PECVD is generally accomplished by energizing a precursor gas into a plasma within the vacuum processing chamber, and depositing a film on the substrate from the energized precursor gas.

During deposition, the plasma within the vacuum processing chamber heats the substrate and the substrate support assembly. The plasma may cause the temperature of the substrate and support assembly to have a temporal temperature increase or spike (e.g., about 30-50° C. increase, or 20%-30% temperature increase from 90° C.). Such a large temperature increase of the substrate and support assembly undesirably causes process variation and/or overheating of the substrate.

Thus, there is a need for an improved temperature control system for a substrate support assembly.

SUMMARY

Embodiments described herein generally relate to a temperature control system for a substrate support assembly disposed in a substrate processing system. In one embodiment, a temperature control system is disclosed herein. The temperature control system includes a remote fluid source and a main frame system. The remote fluid source includes a first reservoir and a second reservoir. The main frame system is coupled with the remote fluid source. The main frame system includes a first fluid loop and a second fluid loop. The first fluid loop is coupled to, and configured to receive a first fluid from, the first reservoir. The second fluid loop is coupled to and configured to receive a second fluid from the second reservoir. The first proportioning valve has a first inlet in communication with the first fluid loop and a second inlet in communication with the second fluid loop. The first proportioning valve has an outlet configured to flow a third fluid comprised of either the first fluid, the second fluid, or a selectively proportional mixture thereof.

In another embodiment, a system for processing a substrate is disclosed herein. The system includes a transfer chamber, a plurality of processing chambers, and a temperature control system. The plurality of processing chambers is coupled to the transfer chamber. Each processing chamber has a substrate support assembly. The temperature control system includes a remote fluid source and a main frame system. The remote fluid source includes a first reservoir and a second reservoir. The main frame system is coupled with the remote fluid source. The main frame system includes a first fluid loop and a second fluid loop. The first fluid loop is coupled to, and configured to receive a first fluid from, the first reservoir. The second fluid loop is coupled to and configured to receive a second fluid from the second reservoir. The first proportioning valve has a first inlet in communication with the first fluid loop and a second inlet in communication with the second fluid loop. The first proportioning valve has an outlet configured to flow a third fluid comprised of either the first fluid, the second fluid, or a selectively proportional mixture thereof.

In another embodiment, a method for controlling a temperature of a substrate support assembly is disclosed herein. A first fluid having a first temperature is circulated in a first fluid loop. A second fluid having a second temperature is circulated in a second fluid loop. A proportioning valve mixes the first fluid and the second fluid. The proportioning valve is configured to create a third fluid having a third temperature. The proportioning valve provides the third fluid to the substrate support assembly in a processing chamber. The third fluid is configured to control the temperature of the substrate support assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
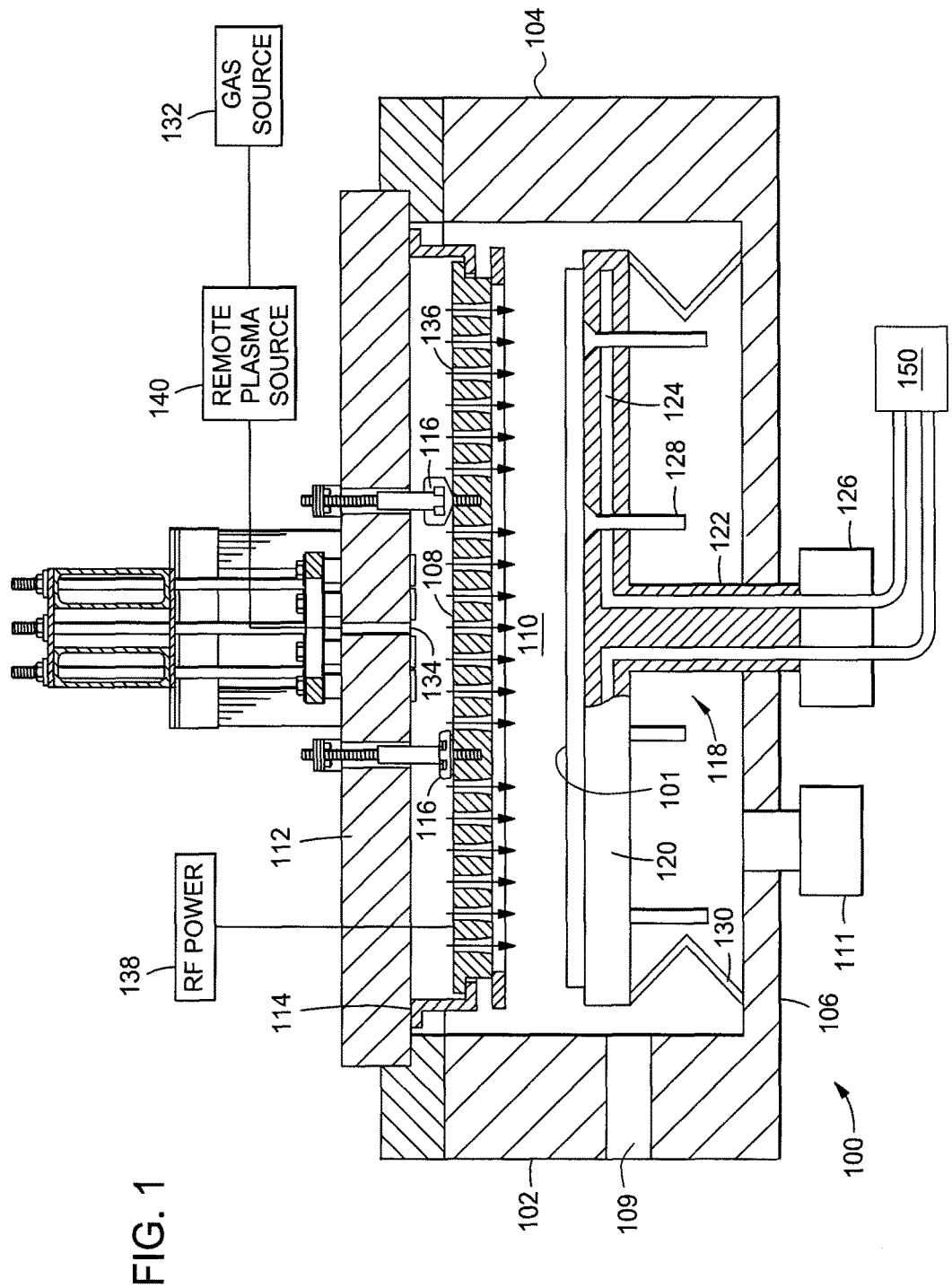
FIG. 1 illustrates a cross-sectional view of a processing chamber, according to one embodiment.

FIG. 1 illustrates a cross-sectional view of a processing chamber 100 having a temperature control system 150, according to one embodiment. The processing chamber 100 may include a chamber body 102 having sidewalls 104, a bottom 106, and a showerhead 108 that define a processing volume 110. The processing volume 110 is accessed through an opening 109 formed through the sidewalls 104.

The showerhead 108 may be coupled to a backing plate 112. For example, the showerhead 108 may be coupled to the backing plate 112 by a suspension 114 at the periphery of the backing plate 112. One or more coupling supports 116 may be used to couple the showerhead 108 to the backing plate 112 to aid in controlling sag of the showerhead 108.

The processing chamber 100 further includes a substrate support assembly (or susceptor) 118 disposed in the processing volume 110. The substrate support assembly 118 includes a support plate 120 and a stem 122 coupled to the support plate 120. The support plate 120 is configured to support a substrate 101 during processing. The support plate 120 includes temperature control elements 124. The temperature control elements 124 are configured to maintain the substrate support assembly 118 at a desired temperature. The temperature control elements 124 are coupled to the temperature control system 150. In one embodiment, the temperature control system 150 is external to the processing chamber 100.

A lift system 126 may be coupled to the stem 122 to raise and lower the support plate 120. Lift pins 128 are moveably disposed through the support plate 120 to space the substrate 101 from the support plate 120 to facilitate robotic transfer of the substrate 101. The substrate support assembly 118 may also include RF return straps 130 to provide an RF return path at the periphery of the substrate support assembly 118.

A gas source 132 may be coupled to the backing plate 112 to provide processing gas through a gas outlet 134 in the backing plate 112. The processing gas flows from the gas outlet 134 through gas passages 136 in the showerhead 108. A vacuum pump 111 may be coupled to the processing chamber 100 to control the pressure within the processing volume 110. An RF power source 138 may be coupled to the backing plate 112 and/or to the showerhead 108 to provide RF power to the showerhead 108. The RF power creates an electric field between the showerhead 108 and the substrate support assembly 118 so that a plasma may be generated from the gases between the showerhead 108 and the substrate support assembly 118.

A remote plasma source 140, such as an inductively coupled remote plasma source, may also be coupled between the gas source 132 and the backing plate 112. Between processing substrates, a cleaning gas may be provided to the remote plasma source 140 so that a remote plasma is generated and provided into the processing volume 110 to clean chamber components. The cleaning gas may be further excited while in the processing volume 110 by power applied to the showerhead 108 from the RF power source 138. Suitable cleaning gases include but are not limited to $NF_3$, $F_2$, and $SF_6$.

As discussed above, the temperature control system 150 is utilized to control the temperature of the substrate support assembly 118 and substrate 101 supported thereon during processing. The temperature control system 150 generally provides a heat transfer fluid through the stem 122 to the temperature control elements 124 disposed in the substrate support assembly 118. The temperature and amount of the heat transfer fluid provided to the temperature control elements 124 may be controlled by the temperature control system 150 so that the substrate support assembly 118 and substrate 101 supported thereon may be maintained at a desired temperature during processing.

Figure 2:
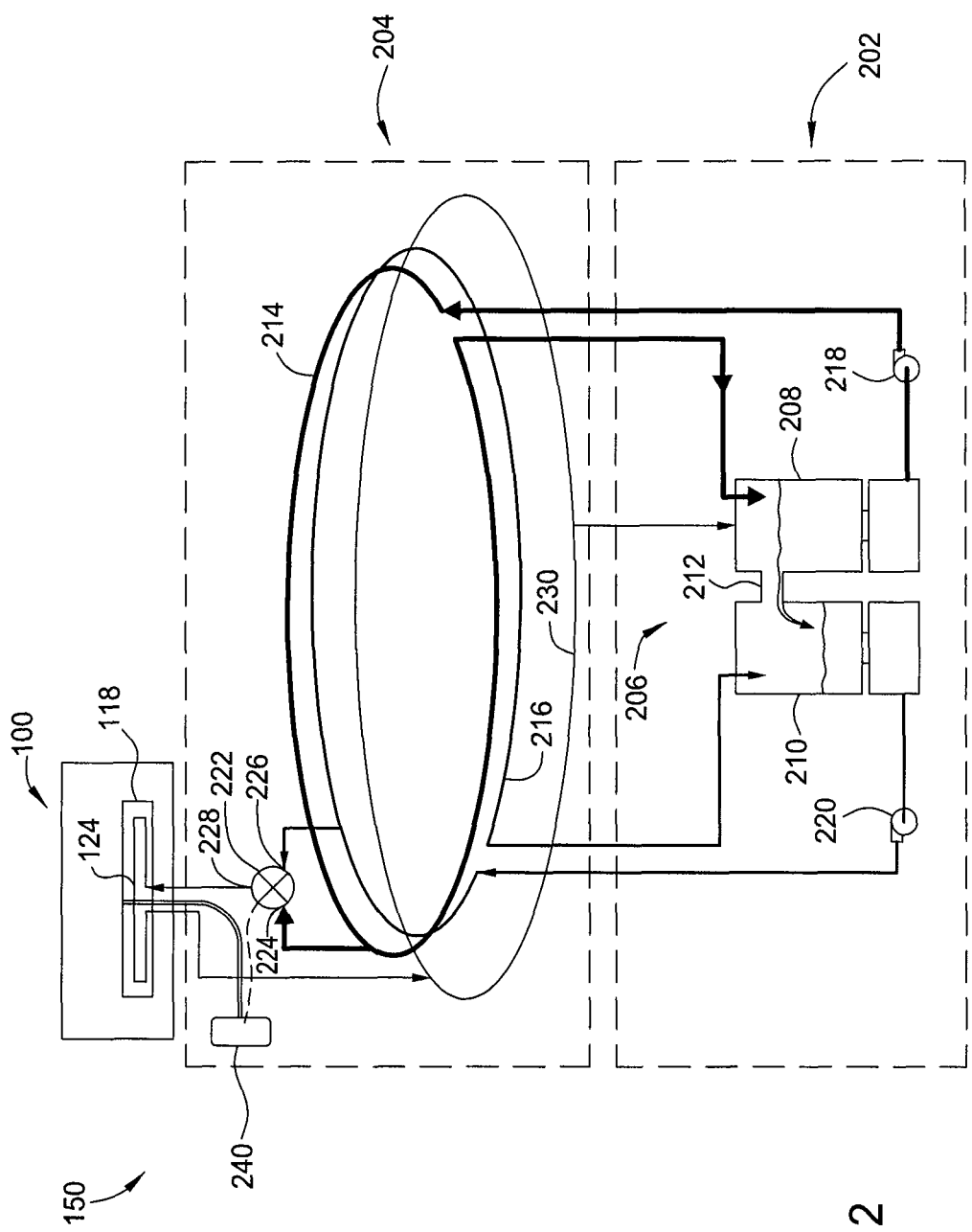
FIG. 2 illustrates the temperature control system of FIG. 1, according to one embodiment.

FIG. 2 illustrates the temperature control system 150, according to one embodiment. The temperature control system 150 includes a remote fluid source 202 and a main frame 204 coupled with the remote fluid source 202. The remote fluid source 202 includes a first reservoir 208 and a second reservoir 210. The first reservoir 208 and second reservoir 210 may be configured as a single a container 206. The first reservoir 208 is configured to provide heat transfer fluid (hereinafter referred to as "first fluid") at a temperature at or below 60° C. In one embodiment, the first reservoir 208 is configured to maintain the heat transfer fluid to 30° C. The second reservoir 210 is configured to provide heat transfer fluid (hereinafter "second fluid") at a temperature greater than 60° C. In one embodiment, the second reservoir 210 is configured to maintain the heat fluid at least 20° C. warmer than the heat transfer fluid disposed in the first reservoir 208. For example, second reservoir 210 may be configured to maintain the heat fluid at about 90° C. The container 206 may include a transition element 212 fluidly coupling the first reservoir 208 to the second reservoir 210. When the amount of heat transfer fluid present one of the reservoirs 208, 210 is filled to the location of the transition element 212, the excess heat transfer fluid will flow to the transition element 212 to the reservoir 208, 210 containing the lesser amount of heat transfer fluid.

The main frame 204 includes a first fluid loop 214 and a second fluid loop 216. The first fluid loop 214 is configured to flow a first fluid from and back to the first reservoir 208. In one embodiment, the first fluid loop 214 is configured to flow cold (i.e., less than or equal to about 60° C.) heat transfer fluid from the first reservoir 208. The cold fluid may be provided by a first pump 218 that is in communication with both the first reservoir 208 and the first fluid loop 214. The cold fluid may circulate through the first fluid loop 214 and back into the first reservoir 208. By continually flowing the cold fluid from the first reservoir 208, through the first fluid loop 214, and back into the first reservoir 208, the fluid within the first fluid loop 214 is maintained at a substantially constant temperature. For example, the cold fluid within the first fluid loop 214 may be maintained at a temperature of 30° C.

The second fluid loop 216 is configured to flow a second fluid from and back to the second reservoir 210. In one embodiment, the second fluid loop 216 is configured to flow a hot (i.e., greater than about 60° C.) heat transfer fluid from the second reservoir 210. The hot fluid may be provided by a second pump 220 that is in communication with both the second reservoir 210 and the second fluid loop 216. The hot heat transfer fluid may circulate through the second fluid loop 216 and back into the second reservoir 210. By continually flowing the hot fluid through the second fluid loop 216, the heat transfer fluid within the second fluid loop 216 may be maintained at a substantially constant temperature. For example, the hot fluid may be maintained at a temperature of about 90° C.

The main frame 204 further includes a proportioning valve 222. The proportioning valve 222 includes a first inlet 224, a second inlet 226, and an outlet 228. The first inlet 224 is fluidly coupled to the first fluid loop 214. For example the first inlet 224 may receive a portion of the cold heat transfer fluid passing through the first fluid loop 214. The second inlet 226 is fluidly coupled to the second fluid loop 216. For example, the second inlet 226 may receive a portion of the hot heat transfer fluid passing through the second fluid loop 216.

The proportioning valve 222 is configured to selectively control the ratio of first fluid entering the first inlet 224 from the first fluid loop 214 and second fluid entering the second inlet 226 from the second fluid loop 216 exiting the proportioning valve 222 through the outlet 228. The ratio of heat transfer fluid (hereinafter referred to as "third fluid") exiting the outlet 228 may be controlled through the complete range of 100 percent first fluid through 100 percent second fluid. Controlling the ratio of the first and second fluids exiting the proportioning valve 222 as the third fluid enables the temperature of the third fluid to be set a predetermined temperature. For example, the proportioning valve 222 may mix the first fluid and the second fluid together in a manner that controls a temperature of the third fluid exiting the proportioning valve 222 for controlling the temperature of some element coupled thereto. The desired temperature of the third fluid is generally less than or equal to the temperature of the hot heat transfer fluid and greater than or equal to the temperature of the cold heat transfer fluid. The third fluid is provided from the outlet 228 to the temperature control elements 124 in the processing chamber 100 where it is utilized to regulate the temperature of the substrate support assembly 118.

In one embodiment, a proportional-integral-derivative (PID) controller 240 may be coupled to the proportioning valve 222. The PID controller 240 is configured continuously calculate an error value as the difference between a desired set point and a measured temperature of the substrate or the substrate support assembly 118 to control the amount of first fluid and the amount of second fluid that is provided through the proportioning valve 222 to the substrate support assembly 118.

In one embodiment, the main frame 204 further includes a fluid return conduit 230. The fluid return conduit 230 is configured to receive the third fluid as it exits the substrate support assembly 118 from the temperature control elements 124. The fluid return conduit 230 in configured to flow the third fluid to the fluid source 202. In the embodiment shown in FIG. 2, the third fluid is returned through the fluid return conduit 230 to the first reservoir 208.

Figure 3:
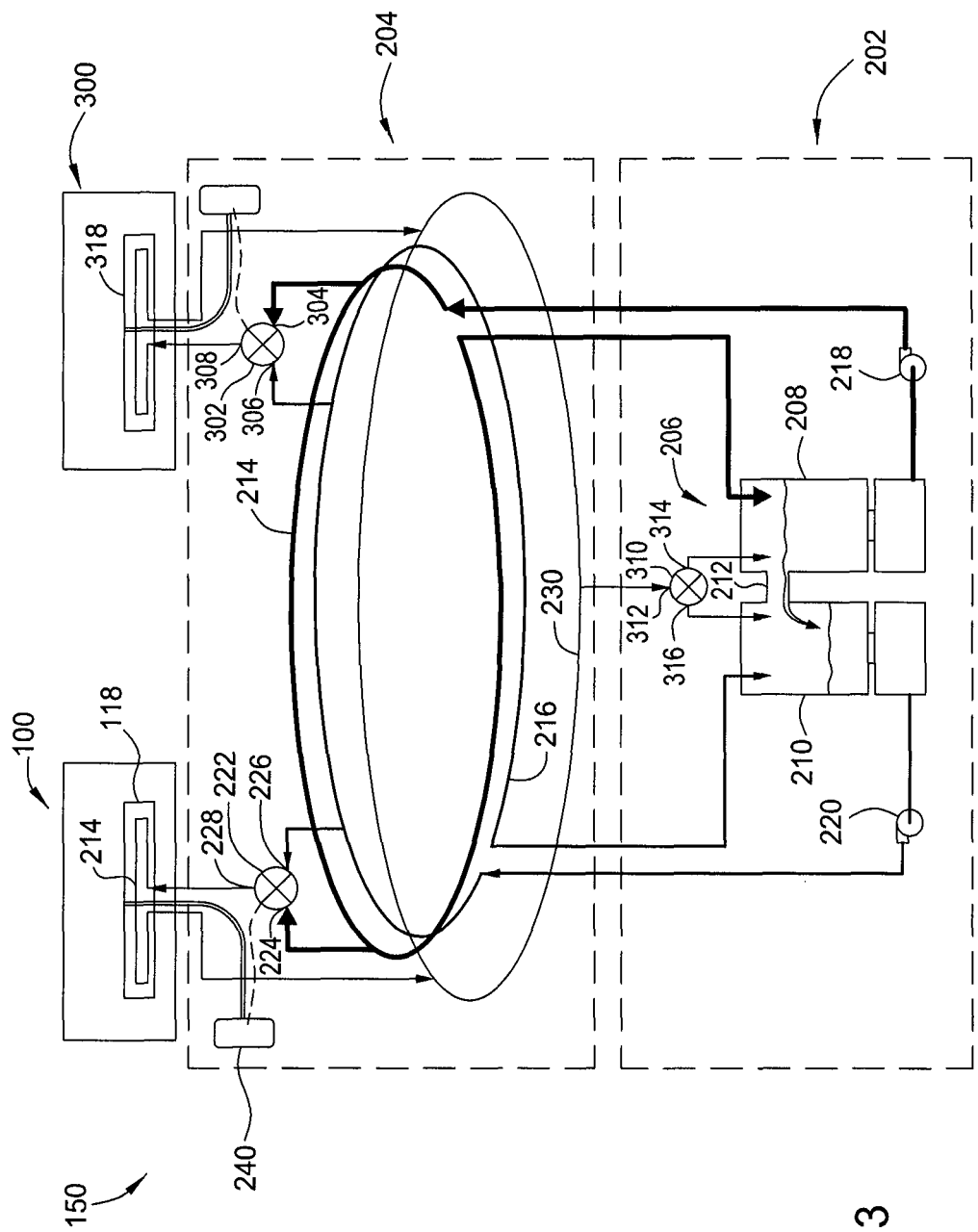
FIG. 3 illustrates the temperature control system of FIG. 1, according to another embodiment.

FIG. 3 illustrates the temperature control system 150, according to another embodiment. The temperature control system 150 may further include a second proportioning valve 302. The second proportioning valve 302 is substantially similar to proportioning valve 222. The second proportioning valve 302 includes a first inlet 304, a second inlet 306, and an outlet 308. The first inlet 304 is fluidly coupled to the first fluid loop 214. For example the first inlet 304 may receive a portion of the cold heat transfer fluid passing through the first fluid loop 214. The second inlet 306 is fluidly coupled to the second fluid loop 216. For example the second inlet 306 may receive a portion of the hot heat transfer fluid passing through the second fluid loop 216.

The second proportioning valve 302 is configured to selectively control the ratio of first fluid entering the first inlet 304 from the first fluid loop 214 and second fluid entering the second inlet 306 from the second fluid loop 216 exiting the second proportioning valve 302 through the outlet 308. The ratio of heat transfer fluid exiting the outlet 308 may be controlled through the complete range of 100 percent first fluid through 100 percent second fluid. For example, the second proportioning valve 302. For example, the second proportioning valve 302 may mix the first fluid and the second fluid to alter the temperature of the heat transfer fluid to a fourth temperature (hereinafter "fourth fluid"). The desired temperature of the fourth fluid is generally less than or equal to the temperature of the hot heat transfer fluid and greater than or equal to the temperature of the cold heat transfer fluid. In one embodiment, the fourth fluid has a temperature equal to the temperature of the third fluid. In another embodiment, the fourth fluid may have a temperature different from the temperature of the third temperature. The fourth fluid is provided from the outlet 308 to a second substrate support assembly 318 in a second processing chamber 300 where it is utilized to regulate the temperature of the substrate support assembly 318.

The temperature control system 150 may further include a return valve 310. The return valve 310 includes an inlet 312, a first outlet 314, and a second outlet 316. The inlet 312 is fluidly coupled the fluid return conduit 230. The return valve 310 is configured to change states so as to direct fluid returning from the fluid return conduit 230 to either the first reservoir 208 or the second reservoir 210 depending on the temperature of the fluid received from the fluid return conduit 230. For example, if fluid exiting the fluid return conduit 230 has a temperature greater than 60° C., the return valve 310 is set to a state that directs the fluid received from the fluid return conduit 230 through the first outlet 314 to the second reservoir 210. If however, the fluid exiting the fluid return conduit 230 has a temperature less than 60° C., the return valve 310 is set to a state that directs the fluid received from the fluid return conduit 230 through the second outlet 316 and into the first reservoir 208.

Figure 4:
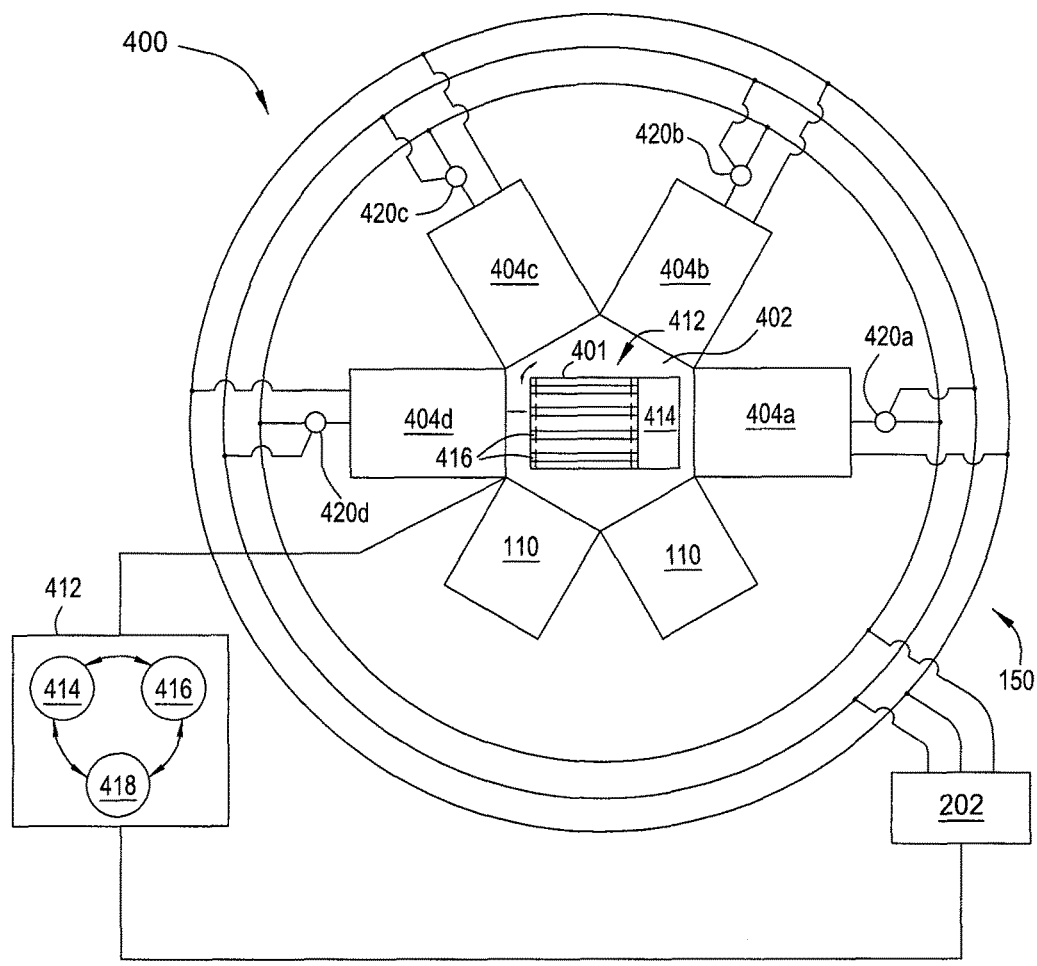
FIG. 4 illustrates a substrate processing system using the temperature control system of FIG. 2 or 3, according to one embodiment.

In general, the temperature control system 150 may include n proportioning valves configured to provide n different fluids to n separate processing chambers. FIG. 4 illustrates a processing system 400 having the temperature control system 150.

The processing system 400 includes a transfer chamber 402 and a plurality of processing chambers 404a-404d. Each processing chamber 404a-404d is coupled to the transfer chamber 402. The processing chambers 404a-404d may be outfitted to perform a number of substrate operations, such as etch, pre-clean, bake, thin film deposition, or other substrate processes. In one embodiment, the processing chambers 404a-404d are each PECVD chambers, such as that described in FIG. 1.

The processing system 400 further includes the temperature control system 150. The temperature control system 150 includes proportioning valves 420a-420d corresponding to the processing chambers 404a-404d. Each proportioning valve 420a-420d is configured to provide a fluid having a given temperature to a respective processing chamber 404a-404d.

The processing system 400 may further include one or more load lock chambers 406, a substrate handler 410, and a controller 412. The load lock chambers 406 allow for the transfer of substrates 401 into and out of the processing system 400. Load lock chambers 406 may pump down the substrates introduced into the processing system 400 to maintain a vacuum seal. The substrate handler 410 includes an end effector 412. The end effector 412 is configured to be supported by and move relative to the remainder of the substrate handler 410 to transfer the substrate 401. The end effector 412 includes a wrist 414 and a plurality of fingers 416 extending horizontally therefrom. The fingers 416 are adapted to support the substrate 401 thereon. The substrate handler 410 may transfer the substrates between load lock chambers 406 and the processing chambers 404a-404d. The substrate handler 410 may also transfer the substrates between the load lock chambers 406 and the transfer chamber 402.

The controller 412 may be configured to operate all aspects of the processing system 400, such as the method disclosed below in conjunction with FIG. 5. For example, the controller 412 may be configured to process a substrate by transferring the substrate among processing chambers 404a-404d in the processing system 400. In another example, the controller may be configured to control the temperature of the fluid provided to each processing chamber 404a-404d from the temperature control system 150.

The controller 412 includes a programmable central processing unit (CPU) 414 that is operable with a memory 416 and a mass storage device, an input control unit, and a display unit (not shown), such as power supplies, clocks, cache, input/output (I/O) circuits, and the liner, coupled to the various components of the processing system to facilitate control of the substrate processing. The controller 412 also includes hardware for monitoring substrate processing through sensors in the processing system 400, including sensors monitoring the precursor, process gas, and purge gas flow. Other sensors that measure system parameters, such as substrate temperature, chamber atmosphere pressure, and the like, may also provide information to the controller 412.

To facilitate control of the processing system 400 described above, the CPU 414 may be one of any form of general purpose computer processor that can be used in an industrial setting, such as a programmable logic controller (PLC), for controlling various chambers and sub-processors. The memory 416 is coupled to the CPU 414 and the memory 416 is non-transitory and may be one or more of readily available memory such as random access memory (RAM), read only memory (ROM), floppy disk drive, hard disk, or any other form of digital storage, local or remote. Support circuits 418 are coupled to the CPU 414 for supporting the processor in a conventional manner. Charged species generation, heating, and other processes are generally stored in the memory 416, typically as software routine. The software routine may also be stored and/or executed by a second CPU (not shown) that is remotely located from the hardware being controlled by the CPU 414.

The memory 416 is in the form of computer-readable storage media that contains instructions, that when executed by the CPU 414, facilitates the operation of the processing system 400. The instructions in the memory 416 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 5:
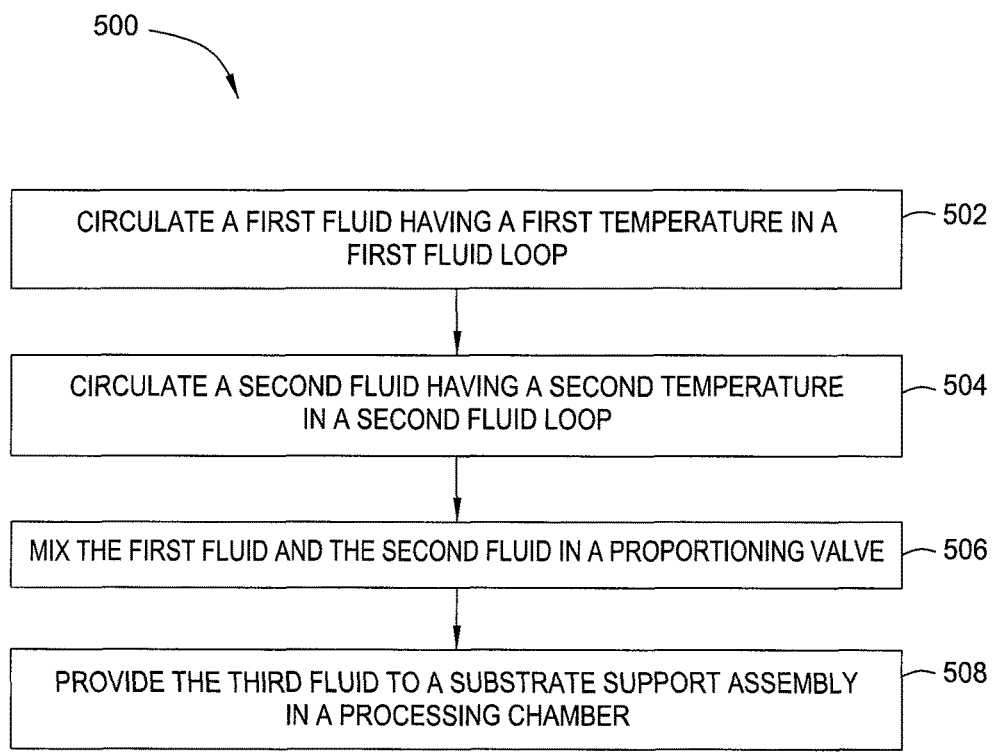
FIG. 5 is a flow diagram illustrating a method of controlling a temperature of a substrate support assembly using a temperature control system, according to one embodiment.

FIG. 5 is a flow diagram illustrating a method 500 of controlling a temperature of a substrate support assembly using a temperature control system. The method 500 begins at block 502. At block 502, a first fluid having a first temperature is circulated in a first fluid loop. The first fluid loop is coupled to a first reservoir. For example, the first reservoir may be configured to maintain the first fluid at a temperature less than 60°. The first reservoir is configured to provide the first fluid to the first fluid loop.

A block 504, a second fluid having a second temperature is circulated in a second fluid loop. The second fluid loop is coupled to a second reservoir. For example, the second reservoir may be configured to maintain the second fluid at a temperature greater than 60°. The second reservoir is configured to provide the second fluid to the second fluid loop. The second temperature of the second fluid is higher than the first temperature of the first fluid.

At block 506, a proportioning valve may mix the first fluid and the second fluid in a ratio ranging from 0:100 to 100:0. The proportioning valve is configured to take a first amount of the first fluid and a second amount of the second fluid to create a third fluid based on a ratio needed to obtain a desired temperature of the third fluid.

At block 508, the proportioning valve provides the third fluid to a substrate support assembly in a processing chamber. The third fluid is configured to control the temperature of the substrate support assembly. For example, the third fluid may flow through the substrate support assembly to maintain a given temperature.

While the foregoing is directed to specific embodiments, other and further embodiments may be devised without departing from the basic scope thereof, and the scope thereof is determined by the claims that follow.

What is claimed is:
1. A temperature control system, comprising:
  a remote fluid source having a first reservoir and a second reservoir; and
  a main frame system coupled with the remote fluid source, comprising:
    a first fluid loop having a start and an end coupled to the first reservoir;
    a second fluid loop having a start and an end coupled to the second reservoir;
    a first proportioning valve having a first inlet coupled to the first fluid loop, a second inlet coupled to the second fluid loop, and an outlet configured to flow a third fluid comprised of either the first fluid, the second fluid, or a selectively proportional mixture thereof;
    a second proportioning valve having a first inlet coupled to the first fluid loop, a second inlet coupled to the second fluid loop, and an outlet configured to flow a fourth fluid comprised of either the first fluid, the second fluid, or a selectively proportional mixture thereof; and
    a fluid return conduit in fluid communication with the first and second proportioning valves, wherein a return valve is coupled to the fluid return conduit, the return valve having a first outlet in fluid communication with the first reservoir and a second outlet in fluid communication with the second reservoir.
2. The temperature control system of claim 1, further comprising:
  a PID controller coupled to the first proportioning valve.
3. The temperature control system of claim 1 further comprising:
  a first substrate support assembly disposed in a first processing chamber, the first substrate support assembly coupled to the outlet of the first proportioning valve.
4. The temperature control system of claim 3 further comprising:
  a second substrate support assembly disposed in a second processing chamber, the second substrate support assembly coupled to the outlet of the second proportioning valve.
5. The temperature control system of claim 1 further comprising:
  a controller configured to control the ratio of the fluids entering the first and second inlets of first proportioning valve controlling the temperature of the fluid flowing from the outlet of the first proportioning valve in response to a desired temperature of some element thermally connected with the outlet fluid flow.
6. A system for processing a substrate, comprising:
  a transfer chamber;

a plurality of processing chambers coupled to the transfer chamber, each processing chamber having a substrate support assembly; and a temperature control system configured to control a temperature of a first substrate support assembly in a first processing chamber, comprising:
   a remote fluid source having a first reservoir and a second reservoir; and
   a main frame system coupled with the remote fluid source, comprising:
      a first fluid loop having a first end and a second end coupled to the first reservoir;
      a second fluid loop having a first end and a second end coupled to the second reservoir;
      a first proportioning valve having a first inlet coupled to the first fluid loop, a second inlet coupled to the second fluid loop, and an outlet configured to flow a third fluid comprised of either the first fluid, the second fluid, or a selectively proportional mixture thereof;
      a second proportioning valve having a first inlet coupled to the first fluid loop, a second inlet coupled to the second fluid loop, and an outlet configured to flow a fourth fluid comprised of either the first fluid, the second fluid, or a selectively proportional mixture thereof; and
      a fluid return conduit in fluid communication with the first and second proportioning valves, wherein a return valve is coupled to the fluid return conduit, the return valve having a first outlet in fluid communication with the first reservoir and a second outlet in fluid communication with the second reservoir.

7. The system of claim 6, further comprising:
a PID controller coupled to the first proportioning valve.

8. The system of claim 6, wherein the first fluid has a first temperature, the second fluid has a second temperature, and the third fluid has a third temperature, the first temperature lower than the second temperature and the third temperature is greater than or equal to the first temperature and less than or equal to the second temperature.

9. The system of claim 6, further comprising:
a second substrate support assembly disposed in a second processing chamber coupled to the outlet of the second proportioning valve.

10. The system of claim 6, further comprising:
a controller configured to control the ratio of the fluids entering the first and second inlets of first proportioning valve controlling the temperature of the fluid flowing from the outlet of the first proportioning valve in response to a desired temperature of some element thermally connected with the outlet fluid flow.

* * * * *